US006628793B1

(12) United States Patent
Porzilli et al.

(10) Patent No.: US 6,628,793 B1
(45) Date of Patent: Sep. 30, 2003

(54) SPEAKER SYSTEM

(76) Inventors: Mark G. Porzilli, 6300 W. Tropicana Ave. #395, Las Vegas, NV (US) 89103; J. Craig Oxford, 1211 Belle Meade Blvd., Nashville, TN (US) 37205

( * ) Notice: Subject to any disclaimer, the term of this patent is extended or adjusted under 35 U.S.C. 154(b) by 0 days.

(21) Appl. No.: 09/478,319

(22) Filed: Jan. 6, 2000

Related U.S. Application Data

(60) Provisional application No. 60/115,283, filed on Jan. 6, 1999.

(51) Int. Cl.$^{7}$ .......................... H04R 25/00; H05K 5/00

(52) U.S. Cl. ........................ 381/182; 381/335; 181/144

(58) Field of Search ................................ 381/182, 386, 381/87, 332, 335, 336, 339, 341, 345, 346, 352, 353, 354; 181/199, 153, 155

(56) References Cited

U.S. PATENT DOCUMENTS

| | | | | |
|---|---|---|---|---|
| 3,247,925 A | | 4/1966 | Warnaka | 181/31 |
| 3,308,237 A | | 3/1967 | Novak | |
| 3,637,039 A | * | 1/1972 | Raichel et al. | |
| 4,008,374 A | | 2/1977 | Tiefenbrun | |
| 4,649,565 A | | 3/1987 | Kaizer et al. | |
| 4,805,729 A | * | 2/1989 | Wascom | |
| 4,884,655 A | * | 12/1989 | Freadman et al. | |
| 4,940,108 A | | 7/1990 | Selby | |
| 5,067,583 A | | 11/1991 | Hathaway | |
| 5,546,468 A | * | 8/1996 | Beard | |

FOREIGN PATENT DOCUMENTS

| | | |
|---|---|---|
| DE | 12 44 865 B | 7/1967 |
| DE | 196 54 956 | 3/1998 |
| JP | 03 101500 | 4/1991 |

OTHER PUBLICATIONS

Patent Abstracts of Japan, vol. 015, No. 288, Jul. 22, 1991, abstract of JP 03 101500.

Patent Abstracts of Japan, vol. 013, No. 254, Jun. 13, 1989, abstract of JP 01 051798.

* cited by examiner

*Primary Examiner*—Sinh Tran

(74) *Attorney, Agent, or Firm*—Malcolm B. Wittenberg; Dergosits & Noah LLP

(57) ABSTRACT

A speaker system comprises a housing that includes a front wall with a plurality of openings, and first and second exterior sidewalls. A plurality of vertically arranged speakers are each placed into an associated one of the plurality of openings and secured to the housing. A hemispherical concave interior wall is positioned in back of the plurality of speakers and within said first and second sidewalls to disperse and attenuate audio waves within the housing. The first and second interior sidewalls extend from front to back and preferably taper inward from back to front of the speaker system, wherein the first and second interior sidewalls each mate with the hemispherical concave interior wall. The plurality of speakers preferably include mid-range drivers and tweeters. For example, several mid-range speakers/drivers are arranged in a series configuration to provide a mid-range sub-array, and the number of mid-range drivers placed into each sub-array is selected such that the total Q factor for the sub-array is approximately one.

9 Claims, 6 Drawing Sheets

SPEAKER SYSTEM

CROSS REFERENCE TO RELATED APPLICATIONS

This application claims priority from the provisional application designated Ser. No. 60/115,283 filed Jan. 6, 1999 and entitled “Loudspeaker System”. This application is hereby incorporated by reference.

BACKGROUND OF THE INVENTION

The present invention relates to loudspeakers, and in particular to a loudspeaker system comprising a multi-driver array.

Audiophiles are constantly seeking improved speaker systems for theater (e.g., home theaters) and listening rooms that provide good audio performance. Prior art speaker systems have been limited by their dynamic frequency response and frequency selective dispersion.

Therefore, there is a need for an improved speaker system.

SUMMARY OF THE INVENTION

Briefly, according to the present invention, a speaker system comprises a housing that includes a front wall with a plurality of openings, and first and second exterior sidewalls. A plurality of vertically arranged speakers are each placed into an associated one of the plurality of openings and secured to the housing. A hemispherical concave interior wall is positioned in back of the plurality of speakers and within said first and second sidewalls to disperse and attenuate audio waves within the housing.

The housing may also include a tuned, dampening bisector that is mounted to the hemispherical concave interior wall positioned in back of said plurality of speakers and within the first and second sidewalls. The bisector is preferably located at the center of the hemispherical concave interior wall. A rear exterior wall defines a back of the speaker system and the front wall defines a front of the speaker system. The first and second interior sidewalls extend from front to back and preferably taper inward from back to front of the speaker system, wherein the first and second interior sidewalls each mate with the hemispherical concave interior wall.

The plurality of speakers preferably include mid-range drivers and tweeters. For example there may be two tweeters associated with every mid-range driver. In one embodiment there are for example twenty-one mid-range driver and forty-two tweeters, wherein two tweeter openings are adjacent to an associated one of the mid-range openings. The speakers are arranged electrically in a series/parallel configuration.

According to another aspect of the invention, several mid-range speakers/drivers are arranged in a series configuration to provide a mid-range sub-array. The number of mid-range drivers placed into each sub-array is selected such that the total Q factor for the sub-array is approximately one.

Advantageously, the present invention provides improved transient response, resonance reduction, lower distortion and an improved low frequency bandwidth. The internal structure of the housing reduces rear waves and resonance to near free air characteristics. In addition, the present invention includes a line source with a relatively narrow aperture that provides an increased percentage of direct versus reflected sound for improved listening pleasure in a larger listening area within a room. Furthermore, the speaker system of the present invention preferably does not crossover within the frequency range of about 60–6,000 Hz. This provides improved spatial cues to a listener. Historically, rooms shapes have presented great placement challenges for the listener. Notably, the speaker system of the present invention has frequency and dynamic linear dispersion that provides a robust system largely unaffected by room shapes, irregularities and anomalies.

These and other objects, features and advantages of the present invention will become apparent in light of the following detailed description of preferred embodiments thereof, as illustrated in the accompanying drawings.

DETAILED DESCRIPTION OF THE INVENTION

Figure 1:
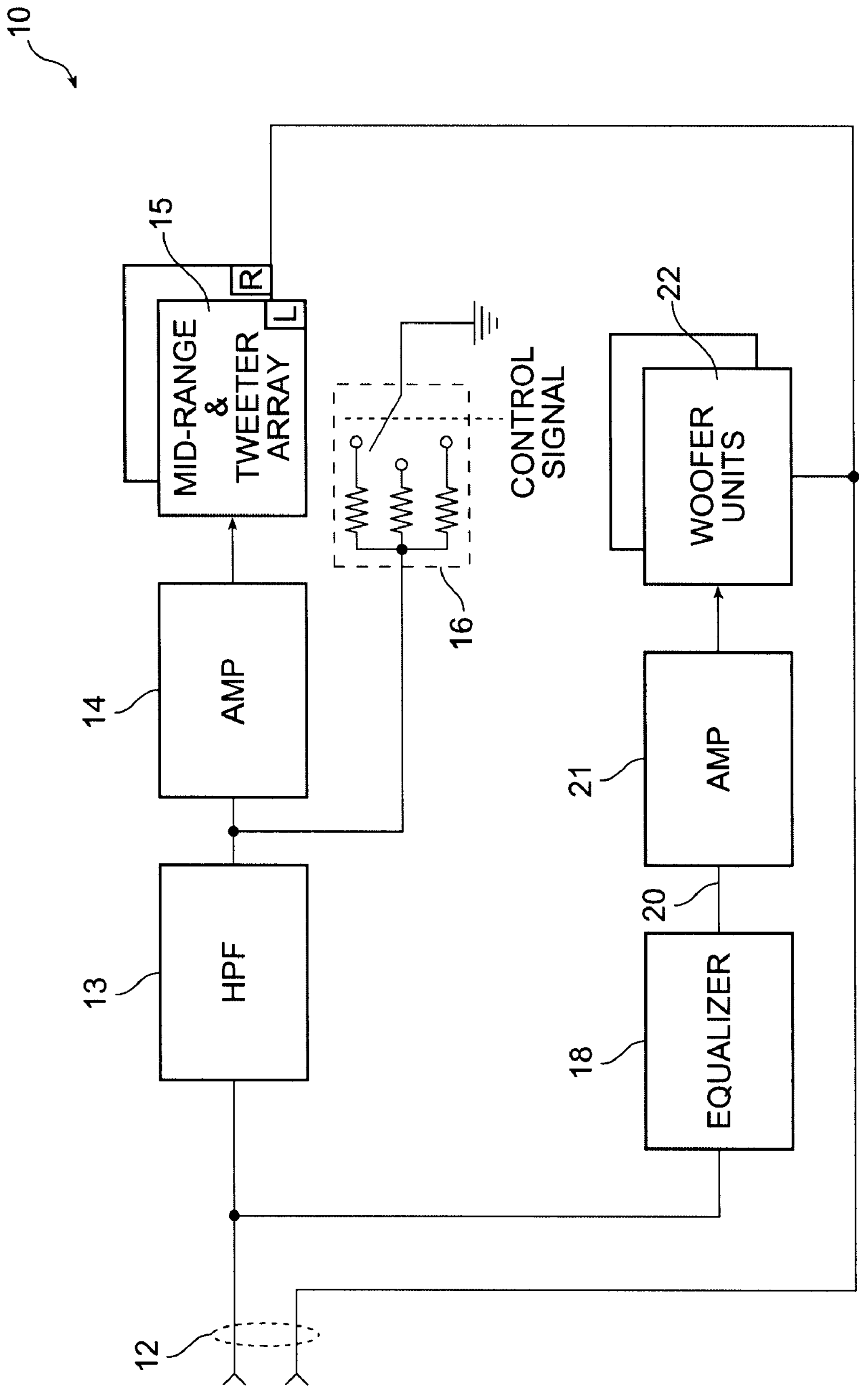
FIG. 1 is a functional illustration of a speaker system.

FIG. 1 is a functional illustration of a speaker system 10. The system 10 includes an input 12 that receives an input signal from a source (e.g., a stereo receiver, a CD player, etc). The input signal is routed along two paths. The first path includes a high pass filter (HPF) 13 (e.g., a series connected capacitor) that provides a high passed signal to an amplifier 14, which provides an amplified signal to a plurality of mid-range/tweeter arrays(s) 15. The first path also includes an impedance matching network 16. The impedance matching network 16 includes a plurality of selectable impedance values in order to account for different amplifier manufacturer/model input impedance. The second path includes an equalizer circuit 18 that provides an equalized signal on a line 20 to an amplifier 21, which provides a low frequency amplified signal to woofer units 22.

Figure 2:
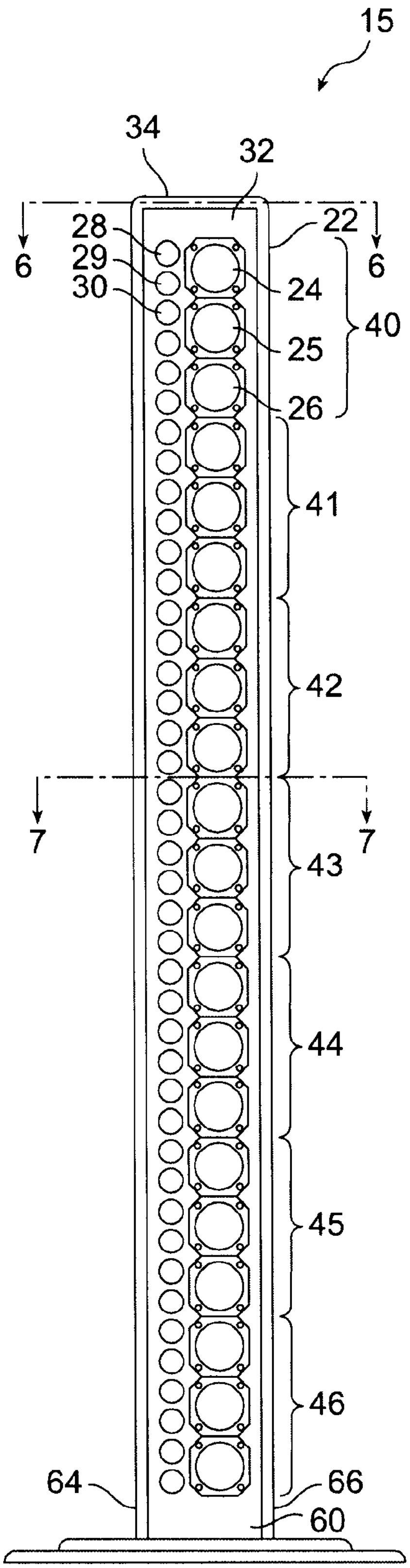
FIG. 2 is a pictorial illustration of the mid-range/tweeter array of the speaker system.

FIG. 2 is a pictorial illustration of the mid-range/tweeter array 15. Although only one array is illustrated, the system preferably includes two mid-range/tweeter arrays that are mirror imaged pairs. The mid-range/tweeter array 15 (e.g., the right speaker of the mirror imaged pair) includes a rigid housing 22, a plurality of mid-range drivers (e.g., 24–26) and a plurality of tweeters (e.g., 28–30). The housing 22 may be constructed of wood, or molded or fabricated polymer. The molded polymer may be densified with non-resonant material. In general, the housing should be relatively rigid and to reduce standing waves and resonances within the housing. It contemplated that the housing may also be formed from of a resin impregnated carbon fiber kevlar mix, that may also include balsa wood or fiber glass. Aluminum and epoxy honeycomb may also be suitable housing materials.

The mid-range drivers 24–26 and the tweeters 28–30 are preferably arranged in a planar surface of the housing. The mid-range drivers 24–26 are preferably in a first column 32, while the tweeters are arranged in a second column 34. Each of the mid-range drivers operates from approximately 60 Hz to 6 kHz, while the tweeters operate from about 6 kHz to 30 kHz, without noticeable crossover.

Figure 3:
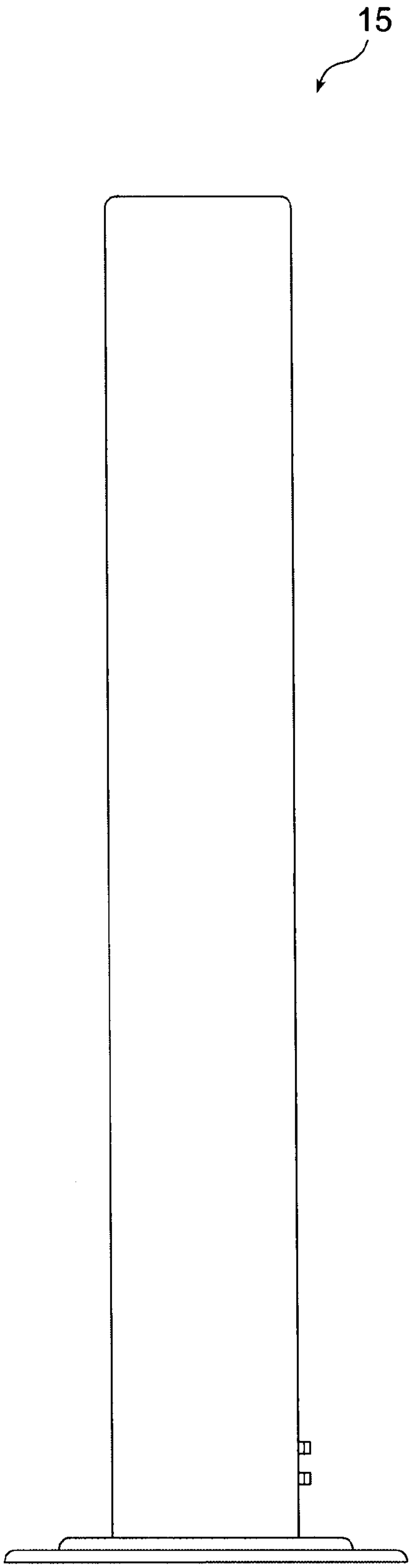
FIG. 3 is a side view of the mid-range/tweeter array illustrated in FIG. 2.

FIG. 3 is a side view of the mid-range/tweeter array 15 illustrated in FIG. 2.

Figure 4:
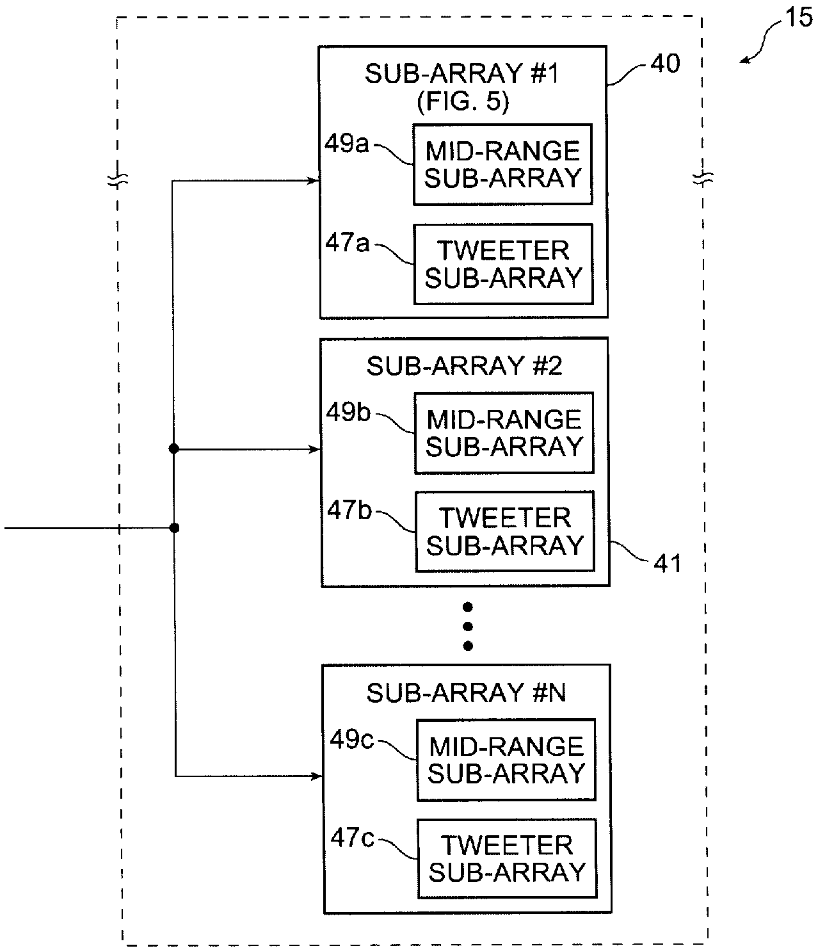
FIG. 4 is a functional block diagram illustration of the mid-range and tweeter arrangement within the mid-range/tweeter array.

Referring again to FIG. 2, in a preferred embodiment the mid-range/tweeter array 15 is partitioned into a plurality of sub-arrays 40–46. Referring now to FIGS. 2 and 4, each sub-array is further partitioned into a tweeter sub-array (e.g., 47*a*–47*c*) and a mid-range sub-array (e.g., 49*a*–49*c*). Each of the mid-range sub-arrays is electrically parallel to one another, while each of the tweeter sub-arrays is parallel to one-another.

Figure 5:
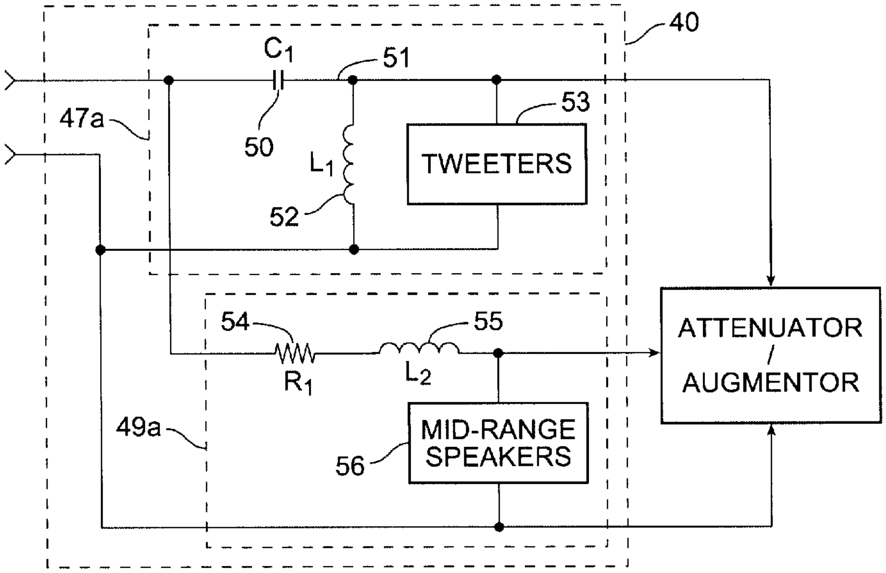
FIG. 5 is a schematic illustration of the mid-range/tweeter array.

FIG. 5 is a schematic illustration of the mid-range/tweeter sub-array 40. The signal input to the sub-array 40 is routed to both the tweeter sub-array 47*a* and the mid-range sub-array 49*a*. The tweeter sub-array 47*a* includes a capacitor $C_1$ 50 that attenuates low frequency signal components to provide a high-pass signal on a line 51. An inductor $L_1$ 52 is located in parallel with a plurality of series connected tweeters 53. The mid-range sub-array 49*a* includes a resistor $R_1$ 54, an inductor $L_2$ 55 and a plurality of series connected mid-range drivers 56. Significantly, this arrangement provides multiple electrically parallel sub-arrays, wherein each of the speakers within a sub-array are electrically in series. The details regarding the characteristics and number speakers within a sub-array shall now be discussed.

The mid-range speakers within the mid-range sub-array 56 preferably have a relatively small moving mass, large magnets and a low quality factor (i.e., a low "Q" factor). The number of individual mid-range speakers within the sub-array 56 is selected so the total Q-factor for the sub-array is approximately one. The Q-factor for the sub-array is the sum of the individual speaker Q-factors multiplied by $\sqrt{2}$. For example, if the individual mid-range speakers have a Q-factor of about 0.21 then the sub-array preferably has three mid-range speakers since $(0.21+0.21+0.21)\times\sqrt{2}$ is equal to 0.89. If the sub-array 56 had four electrically connected speakers then the resultant Q-factor for the sub-array would be 1.19. Therefore, three is the preferred number of speakers in each mid-range sub-array for a mid-range speaker with a Q equal to 0.21. The $\sqrt{2}$ multiplier represents the factor associated with a speaker system having optimal cabinetry. The mid-ranges may be woven carbon fiber units. A Q of one is equal to free air.

Referring still to FIG. 5, the tweeters within the tweeter sub-array 53 are selected primarily based upon their bandwidth and aperture size. In addition, the tweeters are preferably silk domed. As shown in FIG. 2, there are two tweeters mounted adjacent to each mid-range. The tweeters are also arranged in a series/parallel configuration. For example, in one embodiment a plurality of tweeters (e.g., six) are connected in series in the tweeter sub-array, and each tweeter sub-array (e.g., 47*a*, 47*b* and 47*c*) is connected electrically in parallel to the other tweeter sub-arrays. For example, there may be a total of forty-two tweeters in the mid-range/tweeter array 15 (FIGS. 1 and 2), arranged into seven electrically parallel tweeter sub-arrays (e.g., FIG. 2, 40–46) and each comprising six tweeters that are electrically in series. One of ordinary skill will recognize that various series/parallel combinations of the tweeters is possible. In general, it is desirable to have a large number of tweeters. In addition, the tweeters and mid-ranges are mounted within the front panel in order to reduce/minimize defraction and horn loading effects.

Figure 6:
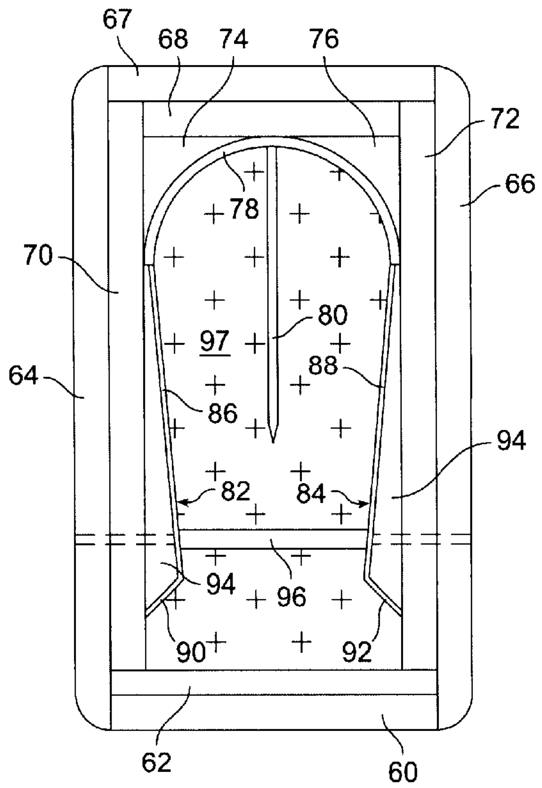
FIG. 6 illustrates a cross-sectional view of the mid-range/tweeter array taken along line 6—6 illustrated in FIG. 2.

FIG. 6 illustrates a cross-sectional view of the array taken along line 6—6 illustrated in FIG. 2 to illustrate the structure of the mid-range/tweeter array housing (the mid-range and tweeters are not shown in this view in the interest of ease of illustration). The housing includes a medium density fiberboard panel 60 and a first solid surface panel 62 (e.g., CORIAN™ or a CORIAN™ type material, or an ultra-high molecular weight polymer, etc.), which are joined with a bonding layer (not shown) located between the two panels 60, 62. As shown in FIG. 1 the fiberboard panel 60 and the first solid surface panel 62 include a plurality of opening for the mid-ranges and tweeters. The housing also includes exterior side panels 64, 66 of, for example, medium density fiberboard. The housing may also include a wood veneer wrap (not shown) that is mounted to the exterior side panels 64, 66 (e.g., mounted with a urea resin bonding layer—not shown). The housing also includes an exterior back wall 67 of medium density fiberboard. A second solid surface panel 68 may be located inside of the exterior back wall 67 and joined to the back wall with a bonding layer (not shown). The interior sides of the exterior side panels 64, 66 are each mounted to medium density fiberboard panels 70, 72 respectively.

The housing also includes shaped medium density fiberboard blocks 74, 76 and a hemispherical concave interior wall 78. The hemispherical wall 78 may be formed of polyvinyl chloride (PVC), which provides no parallel surfaces to sounds radiating into the hemispherical wall 78. A tuned, dampening bisector 80 is mounted to the hemispherical concave interior wall 78. The bisector 80 is preferably located at the center of the hemispherical concave interior wall 78. First and second interior sidewalls 82, 84 are segmented and a first segment 86 extends from front to back of the housing and preferably taper inward from back to front along the majority of the sidewall length. The first and second interior sidewalls 82, 84 each mate with the hemispherical concave interior wall 78. Second segments 90, 92 of the interior sidewalls 82, 84 respectively, taper outward. High density particle board 94 is located between the first and second interior sidewalls and the medium density fiberboard panels 70, 72. A plurality of vertically spaced lateral supports (e.g., support 96) are also included for increased unit rigidity. The lateral supports may be expandable and contractible to increase or decrease the separation of the sidewalls 82, 84. This feature allows a user to adjust the separation in order vary the speaker characteristics.

Acoustical attenuating material 97 is located within the remaining open spaces of the speaker to attenuate rear waves (i.e., wave launches toward the back of the housing). The acoustical attenuating material preferably comprises multiple fibers. The multiple fibers may include 80% cotton and 20% dacron. These percentages are percent-by-weight (PBW). An alternative material composition is 10% acrylic, 30% wool and 60% cotton fibers PBW. One of ordinary skill will recognize that there are many alternative acoustical attenuating materials that may be utilized.

Figure 7:
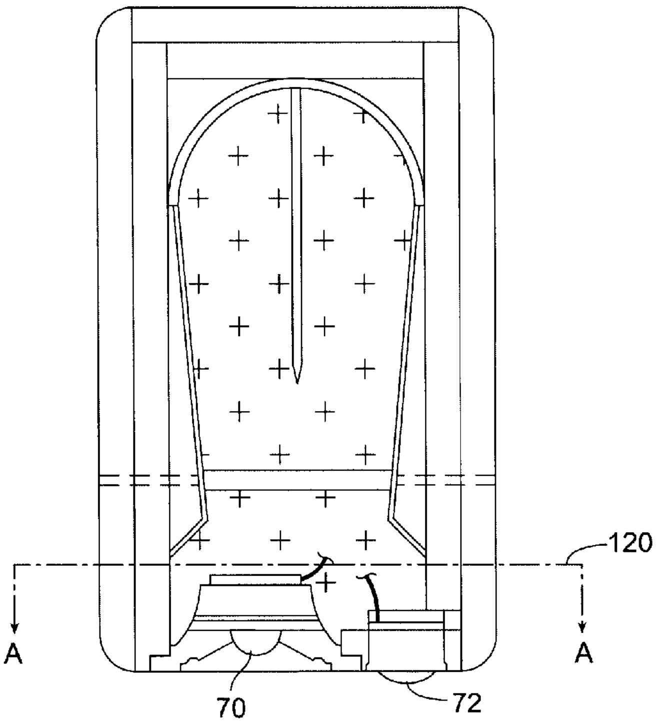
FIG. 7 illustrates another cross-sectional view of the mid-range/tweeter array taken along line 7—7 illustrated in FIG. 2.

FIG. 7 illustrates another cross-sectional view of the array taken along line 7—7 illustrated in FIG. 2. Notably, this view illustrates the positioning of the mid-range speaker 70 and the tweeter 72 within the housing. It should be noted that the view set forth in FIG. 2 has the tweeters and mid-ranges positioned on opposite sides from the views set forth in FIG. 7. FIG. 2 represents the right mid-range/tweeter array (tweeters preferably on the outside) while FIG. 7 represents the left mid-range/tweeter array.

Figure 8:
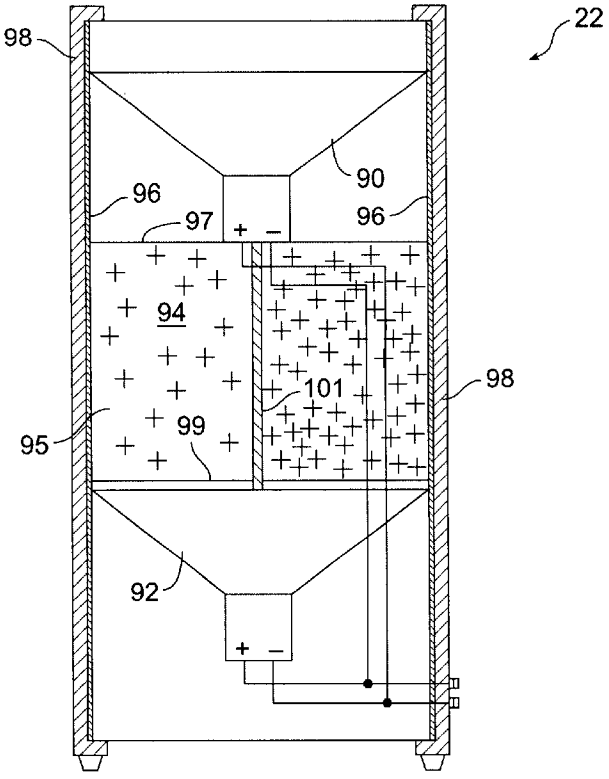
FIG. 8 is a simplified cut-a-way side view of the woofer unit.

FIG. 8 is a simplified cut-a-way side view of the woofer unit 22. The unit 22 includes two woofers 90, 92 that are wired out of phase with respect to one another in a push-pull configuration. The first woofer 90 (e.g., an 18" woofer) is mounted in the upper region of the woofer housing such that the front of the first woofer 90 is open to the outside air. In contrast, the second woofer 92 is mounted in the lower region of the woofer housing and the rear of the second woofer 92 is open of the outside air. That is, the front of the second woofer faces an interior chamber 94 of the woofer unit 22 that includes an acoustical attenuating material/stuffing 95 that is retained between webbing 97, 99. The woofers 90, 92 are mounted within a cylindrical housing 96 (e.g., a PVC pipe) to provide a cylindrical cartridge that is mounted into a woofer housing 98. For example, the cylindrical cartridge may be located within a cylindrical woofer housing or a rectangular woofer housing. The woofer also includes a bisector 101 that extends across the cylindrical housing 96, preferably coaxial with the cylindrical housing.

The mid-range/tweeter array 15 (FIG. 2) provides a line source that moves a large volume of air while retaining a relatively rapid transient speed, concurrent with temporal accuracy having very accurate time and phrase response with a large dynamic range. Historically, the problem of large sound pressure level (SPL) delta over a broad band (dynamic linearity) was addressed utilizing horn loading techniques. However, temporal linearity was virtually negated. That is, there were time and phase problems associated with the horns. The utilization of multi-driver optimal coupling versus large single driven (ribbon) technique affords enormous mass/motor ratio advantage. Optimal coupling of multi-driver arrays enables temporal anomaly cancellation by virtue of series anti-phase electrical coupling concurrent with acoustical mass loading of the rear waves. The present invention provides a generous utility of drivers complement that is relatively expensive, but reduces effective moving mass to near vanishing levels.

This loudspeaker design launches a wavefront front with great dynamic power and speed. The ratio of direct reflected signals is important for near-field effect. The phase and timing of signals reaching the listener are correct giving space queues to the listener better than other designs. Near-field effect means the direct signal reaches the listener before any reflections.

The multiple mid-range drivers work from approximately 65 to 6,000 Hertz with essentially no crossover.

The internal wiring harness is important due to its complexity in series/parallel wiring of so many drivers. Impedance over frequency changes, effecting the sensitivity so this configuration cancels/minimizes this negative characteristic of all speakers in comparison to prior art systems that use a small number of drivers with conventional crossover. A preferred wire for this design is a hollow Teflon® tube with a helix litz braid woven over the tube. These can be combined for multiple conductors and woven or wound to tune impedance, capacitance and resistance.

Electrostatic ribbon or other flat panels or arrays are very directional and the listener must sit precisely in the "sweet spot" at the focal point of the two speakers in the listening room. However, the system of the present invention creates a much larger listening "sweet spot".

Figure 9:
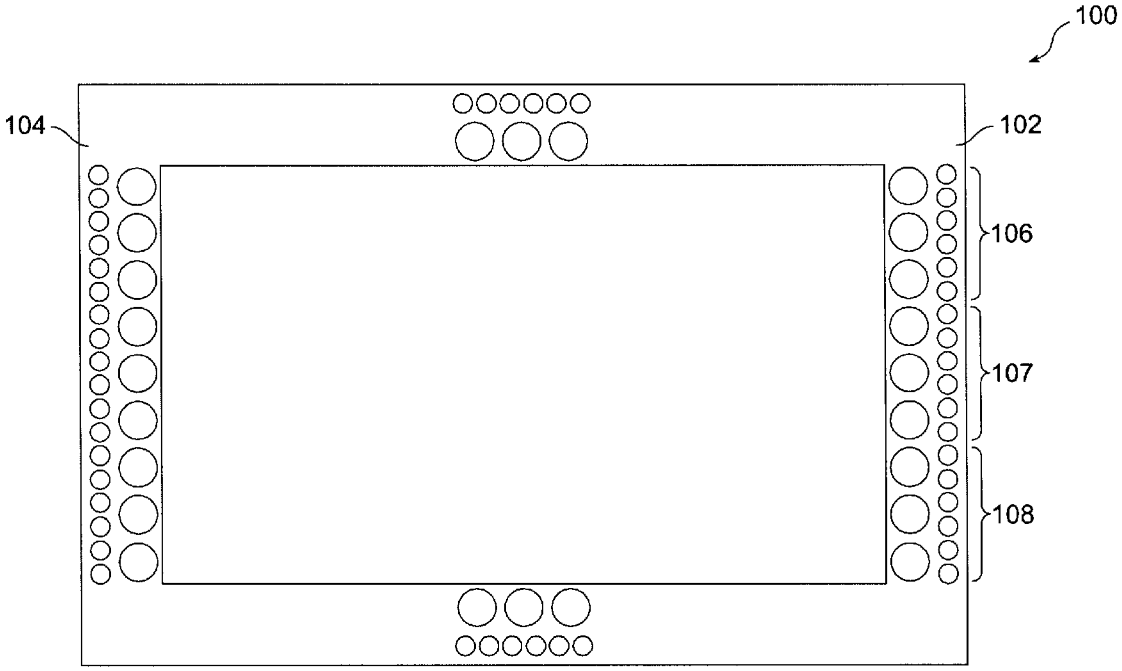
FIG. 9 illustrates an alternative embodiment speaker system.

FIG. 9 illustrates an alternative embodiment speaker system 100. The system 100 is generally arranged in the form a picture frame. Vertical legs 102, 104 of the system 100 include a plurality of speaker sub-arrays (e.g., 106–108) similar to the sub-arrays illustrated in FIG. 4. Each of the speakers/drivers of the same type (i.e., mid-range versus tweeter) in the sub-arrays 106–108 are wired in series, while each of the sub-arrays of the same type are electrically parallel to one another. Significantly, this provides multiple electrically parallel sub-arrays, wherein each of the speakers within a sub-array are electrically in series. The embodiment illustrated in FIG. 9 is similar to the embodiment illustrated in FIG. 2, with the exception that the embodiment in FIG. 9 does not include a deep housing comprising a hemispherical concave interior wall (e.g., element 78 in FIG. 5). Specifically, referring to FIG. 6, it is contemplated that the alternative embodiment speaker system would include a rear wall generally along a line A—A 120. The rear wall may include small discontinuities in order to deflect the rear waves and break-up standing waves within the housing. Notably, this alternative embodiment speaker system may be mounted to a wall adjacent to a flat panel display for a home theatre system, or as shown in FIG. 9 around a flat panel display.

Although the present invention has been shown and described with respect to several preferred embodiments thereof, various changes, omissions and additions to the form and detail thereof, may be made therein, without departing from the spirit and scope of the invention.

What is claimed is:

1. A speaker system, comprising:

a housing that includes a front wall with a plurality of openings, and first and second exterior sidewalls;

a plurality of vertically arranged speakers each placed into an associated one of said plurality of openings and secured to said housing;

a hemispherical concave interior wall positioned in back of said plurality of speakers and within said first and second exterior sidewalls; and a rear exterior wall that defines a back of said speaker system, wherein said front wall defines a front of said speaker system; and first and second interior sidewalls that taper inward in the direction of back to front of said speaker system, wherein said first and second interior sidewalls each mate with said hemispherical concave interior wall.

2. The speaker system of claim 1, wherein said hemispherical concave interior wall comprises a polyvinyl chloride material.

3. A speaker system, comprising:

a housing that includes a front wall with a plurality of openings, and first and second exterior sidewalls;

a plurality of vertically arranged speakers each placed into an associated one of said plurality of openings and secured to said housing;

a hemispherical concave interior wall positioned in back of said plurality of speakers and within said first and second exterior sidewalls, wherein said speakers include a plurality of mid-range speakers and a plurality of tweeters, wherein said mid-range speakers are arranged in a series parallel electrical configuration including a plurality of speaker sub-arrays each electrically in parallel with one another, and each of said plurality of speaker sub-arrays comprising a plurality of mid-range speakers electrically in series.

4. The speaker system of claim 3, wherein each of said mid-ranges speakers within a sub-array has an associated quality (Q) factor, and sum of the quality factors for said mid-range speakers within a sub-array is approximately equal to $1/\sqrt{2}$.

5. The speaker system of claim 3, wherein each of said mid-ranges speakers within a sub-array has an associated quality (Q) factor, and sum of the quality factors for said mid-range speakers within a sub-array is in the range of about 0.5 to 0.9.

6. A speaker system, comprising:

a housing that includes a front wall with a plurality of openings, and first and second exterior sidewalls;

a plurality of vertically arranged speakers each placed into an associated one of said plurality of openings and secured to said housing;

a hemispherical concave interior wall positioned in back of said plurality of speakers and within said first and second exterior sidewalls; and a rear exterior wall that defines a back of said speaker system, wherein said front wall defines a front of said speaker system; and first and second interior segmented sidewalls, each comprising a first segment that tapers inward in the direction of back to front, wherein said first and second interior sidewalls each mate at first ends thereof with said hemispherical concave interior wall.

7. A speaker system comprising:

a housing that includes a front wall with a plurality of openings, and first and second exterior sidewalls;

a plurality of vertically arranged speakers each placed into an associated one of said plurality of openings and secured to said housing, wherein said speakers are partitioned into a plurality of sub-arrays, wherein said sub-arrays includes a plurality of series connected speakers and said sub-arrays are arranged electrically parallel to one another; and a hemispherical concave interior wall positioned in back of said plurality of speakers and within said first and second exterior sidewalls wherein said sub-arrays comprise:

a plurality of mid-range sub-arrays each comprising a plurality of series connected mid-range speakers each having an associated Q-factor, wherein the sum of said associated Q-factors is in the range of about 0.5 to 0.9, and each of said plurality of mid-range sub-arrays is electrically parallel to one another; and a plurality of tweeter sub-arrays each comprising a plurality of series connected tweeters, and each of said plurality of tweeter sub-arrays is electrically parallel to one another.

8. The speaker system of claim 7, further comprising a woofer unit that includes a cylindrical housing comprising a first woofer and a second woofer arranged in a push-pull configuration.

9. The speaker system of claim 8, wherein said woofer unit further comprises a bisector within said cylindrical housing and co-axial with said cylindrical housing, wherein said bisector extends between said first and second woofers.

* * * * *